United States Patent [19]

Sasaki et al.

[11] Patent Number: 4,974,235
[45] Date of Patent: Nov. 27, 1990

[54] METHOD OF ADAPTIVE QUANTIZATION IN DIFFERENTIAL PULSE CODE MODULATION AND A SYSTEM FOR TRANSMITTING QUANTIZED DATA

[75] Inventors: Takayuki Sasaki; Hisayoshi Moriwaki; Hideki Fukasawa, all of Kanagawa; Hiromi Takano, Tokyo; Kenzo Akagiri, Kanagawa, all of Japan

[73] Assignee: Sony Corporation, Tokyo, Japan

[21] Appl. No.: 278,483

[22] Filed: Dec. 1, 1988

[30] Foreign Application Priority Data

Dec. 3, 1987 [JP] Japan .................. 62-306437
Dec. 7, 1987 [JP] Japan .................. 62-309332
Dec. 9, 1987 [JP] Japan .................. 62-311570

[51] Int. Cl.$^5$ .......................... H04B 14/06
[52] U.S. Cl. ......................... 375/27; 360/32; 375/30
[58] Field of Search ............ 381/31, 106; 360/32; 330/14; 370/7; 455/72; 375/27, 30; 364/819, 728.03, 728.07; 341/51, 76

[56] References Cited

U.S. PATENT DOCUMENTS 4,317,208  2/1982  Araseki et al. .......... 375/27
4,468,640  8/1984  Gritton .................. 333/166
4,509,150  4/1985  Davis .................... 375/30
4,587,620  5/1986  Niimi et al. ............. 364/728.07

FOREIGN PATENT DOCUMENTS 0207171  1/1987  European Pat. Off.
2073554  10/1981 United Kingdom .

Primary Examiner—Benedict V. Safourek
Assistant Examiner—Tesfaldet Bocure
Attorney, Agent, or Firm—Hill, Van Santen, Steadman & Simpson

[57] ABSTRACT

A transmission method for digital data which is adapted to transmit a predictive residual at every sample and a predictive coefficient and a normalization gain at every data block to thereby provide highly efficient coding and data transmission.

An adaptive quantization method suitable for use in the above-mentioned digital data transmission, forms samples into a block and a predetermined multiplication is effected on the sample of each of the blocks to thereby improve the accuracy of the predictive coefficients. A stable operation may be ensured in the adaptive quantizing method by cancelling the subsequent operation when the auto-correlation of input data is not recognized.

3 Claims, 6 Drawing Sheets

METHOD OF ADAPTIVE QUANTIZATION IN DIFFERENTIAL PULSE CODE MODULATION AND A SYSTEM FOR TRANSMITTING QUANTIZED DATA

BACKGROUND OF THE INVENTION

1. Field of the Invention

The present invention relates to a method of adaptive quantization in differential pulse code modulation and a system for transmitting quantized data.

2. Description of the Prior Art

The 8-mm video tape recorder, for example, has an optional function for digitizing an audio signal in accordance with PCM (pulse code modulation) as a PCM signal, and recording the same in an overscan interval during recording, and reproducing the original audio signal by the opposite processing thereof during playback or reproduction.

In this event, the audio signal can be recorded and/or reproduced with better characteristics when the sampling frequency, and the quantizing bit length of the PCM signal, are increased. However, such increase in the sampling frequency and the quantizing bit length greatly increases the number of bits to be recorded and/or reproduced, thereby making it impossible to record and/or reproduce the audio signal.

Thus, it has been proposed to compress the bit number of PCM signals upon recording, and expand the bit number upon reproduction, such that excellent recording and/or reproducing characteristics can be obtained even with a fewer number of signal bits recorded on a tape.

One such bit compress and expansion method is a so-called ADPCM system (See "Fundamental Audio Information processing" published by Ohm Co. and Japanese Patent Application No. 61-299285).

OBJECTS AND SUMMARY OF THE INVENTION

It is an object of the present invention to propose an improved transmission method for the ADPCM system.

According to a first aspect of the present invention, there is provided a system for transmitting data quantized in accordance with adaptive quantization in differential pulse code modulation, the quantized data transformed from source data by a predetermined sampling frequency, comprising:

means for producing a predictive coefficient from sampled data contained at every data block, which is composed of a predetermined number of the sampled data;

means for producing a normalization gain from the sampled data at every data block;

means for producing a predictive residual in accordance with the predictive coefficient at every sampled datum in the data block corresponding to the predictive coefficient;

means for normalizing the predictive residual of the data block corresponding to the normalization gain in accordance with the normalization gain:

means for transmitting the normalized predictive residual to a decoder by one sampled data block at a time; and means for transmitting the predictive coefficient and the normalization gain to the decoder, by one data block at a time.

According to a second aspect of the present invention, there is provided a method of adaptive quantization in differential pulse code modulation for quantized data transformed from source data by a predetermined sampling frequency, for coding the source data using a predictive residual at every data block which is composed of a predetermined number of sampled data units, said method comprising the steps of:

detecting auto-correlation of said quantized data;

interrupting the detecting step when it is detected that quantized data does not have the auto-correlation in the detecting step: and setting correlation data, corresponding to data subsequent to the quantized data which does not have the auto-correlation, to a predetermined constant value.

According to a third aspect of the present invention, there is provided a method of adaptive quantization in differential pulse code modulation for quantized data transformed from source data by a predetermined sampling frequency, for coding the source data using a predictive residual at every data block which is composed of a predetermined number of sampled data, the method comprising the steps of:

weighting the quantized data by a predetermined significance;

detecting the largest datum in each of the data blocks multiplying the largest datum by a predetermined coefficient such that the largest datum is larger than a predetermined value; and producing predictive coefficients by multiplying other samples in each of the data blocks by the predetermined coefficient.

The above and other objects, features and advantages of the present invention will become apparent from the following detailed description of the preferred embodiments taken in conjunction with the accompany drawings, throughout which like reference numerals designate like elements and parts.

BRIEF DESCRIPTION OF THE DRAWINGS

FIG. 4 is a circuit block diagram showing a reproducing system of the recording/reproducing apparatus in which the system of the present invention is embodied in the same manner as FIG. 3;

FIG. 5 is a diagram showing a track pattern formed on a magnetic recording medium used in the present invention;

DETAILED DESCRIPTION OF THE PREFERRED EMBODIMENTS

Figure 1:
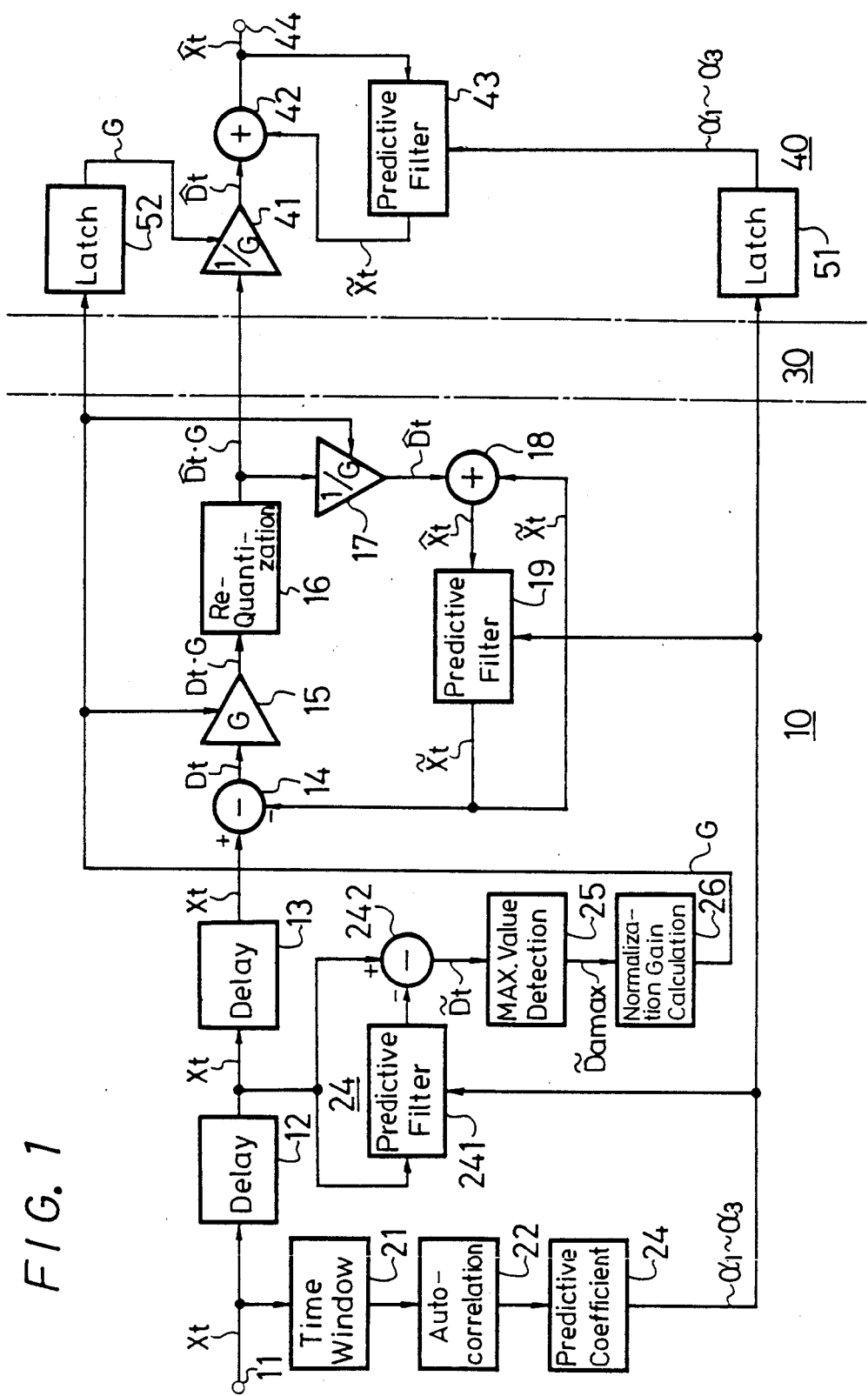
FIG. 1 is a circuit block diagram systematically showing an embodiment of an ADPCM circuit according to the present invention.

FIG. 1 shows an embodiment of the present invention in which one block is formed of 64 samples of sequentially incoming data, and a predictive coefficient of a predictive filter is controlled to an optimal value for each block. In this event, bit-compressed main data is outputted at every one sample of the incoming data, and supplementary data relative to the bit compress is outputted by every one block.

Specifically, in FIG. 1, an encoder section is generally indicated at 10, a signal transmission section or system 30 and a decoder section at 40, respectively. If the embodiment shown in FIG. 1 is applied to a PCM audio system of the 8-mm video tape recorder, for example, the encoder section 10 is provided in its recording system and the decoder section 40 in its reproducing system. Also, the transmission system 30 includes processing circuits such as an error correction circuit, a rotary magnetic head, and so on.

Figure 2:
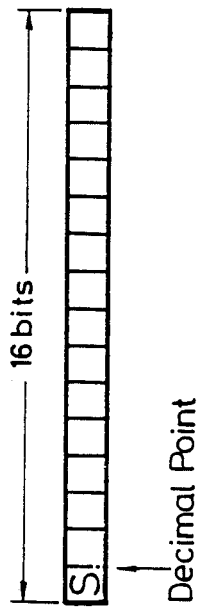
FIG. 2 is a diagram showing the construction of data which is transmitted in accordance with the present invention.

In the encoder section 10, digital data $Xt$ is supplied in parallel, one sample at a time, from an input terminal 11 through delay circuit 12 and 13 to a subtracting circuit 14. In this case, the incoming data $Xt$ is assumed to be a PCM signal which is provided by linearly analog-to-digital (A/D) converting an analog audio signal, wherein the sampling frequency is chosen to be 48 kHz and the quantizing bit number 16 bits, for example. Further, the data $Xt$ is expressed, as shown in FIG. 2, by a condition $-1 \leq Xt < 1$ with a fixed decimal point in 2's complement (the same is also applied to other values).

The delay circuits 12 and 13 are provided to coincide the timing of the main data with that of the supplementary data and respectively have a delay time of one block period (for this reasons strictly speaking, if an input value at the terminal 11 is represented by $Xt$, the output from the delay circuit 13 will be $Xt-128$. However, the output is simply represented by $Xt$ for avoiding complexity).

A predictive value $\tilde{X}t$ for the data $Xt$ is generated from a predictive filter 19 and supplied to the subtracting circuit 14 from which outputted is the difference $Dt$ between the values $Xt$ and $\tilde{X}t$, i.e.

$$Dt = Xt - \tilde{X}t$$

The difference value $Dt$ is an error (predictive residual) of the predictive value $\tilde{X}t$ with respect to the input data value $Xt$. Therefore, the value $Dt$ should be ideally zero ($Dt=0$). It shows generally a small value so that even though the value $Dt$ has a bit length of, for example 16 bits, most of upper-ordered bits (at the side of the MSB) are the same as the symbol bit as shown, for example, below (since it is expressed with the fixed decimal point):

$$Dt = \text{"0.000 ... 011011"}$$

The remaining lower bits (at the side of the LSB) are set to "0" to "1" in accordance with the difference between the values $Xt$ and $Xt$. On the contrary, if the difference value $Dt$ shows a large value, lower ordered bits can be ignored.

Thus, the difference value $Dt$ is supplied to a gain control circuit 15 to be multiplied by a value $G$ ($G \geq 1$) to derive a normalized value $Dt \cdot G$.

The value $Dt \cdot G$ is supplied through a requantizing circuit 16 to a gain control circuit 17 wherein the value $Dt \cdot G$ is divided by a factor of $G$ (or multiplied by $1/G$) to thereby derive a non-normalized value $\hat{D}t$ in the same order as the value $Dt$. This value $\hat{D}t$ is supplied to an adder circuit 18 which is also supplied with the predictive value $\tilde{X}T$ from the filter 19. Then, the adder circuit 18 outputs the sum $\hat{X}t$ of the values $\hat{D}t$ and $\tilde{X}t$ $$\hat{X}t = \tilde{X}T + \hat{D}t$$

which in turn is supplied to the filter 19.

The value $\tilde{X}t$ in this case is a predictive value for the value $Xt$ and the value $\hat{D}t$ is a value derived by rounding off or cutting away the lower bits of the difference $Dt$ at this time of predication, so that the sum $\hat{X}t$ of the values $\tilde{X}t$ and $\hat{D}t$ is almost equal to the input value $Xt$. Since the value $\hat{X}t$ is supplied to the filter 19, the filter output value $\tilde{X}t$ is regarded to be a value predicting a value $S_{t+1}$ at the time of the next sampling.

The value $Dt \cdot G$ from the re-quantizing circuit 16 is supplied to the decoder section 40 through the transmission system 30.

In the decoder section 40, the value $Dt \cdot G$ is divided by a factor of $G$ (multiplied by $a/G$) in a gain control circuit 41 to derive the value $Dt$ which is supplied to an adder circuit 42. The output from the adder circuit 42 is delivered to an output terminal 44 as well as supplied to a predictive filter 43 constructed in the same manner as the predictive filter 19. The output from the filter 43 is fed back to the adder circuit 42.

It will therefore be understood that the filter 43 outputs the value $\tilde{X}t$ and the terminal 44 is fed with the data $\hat{X}t$ which is derived by rounding off the lower bits of the input data $Xt$, that is, the digital data $\hat{X}t$ almost equal to the input data $Xt$.

Further, the following circuits are provided for optimizing the predictive coefficients of the predictive filters 19 and 43 for each block.

That is, the predictive filters 19 and 43 are third-order filters using, for example, PARCOR coefficient as the predictive coefficient. The first-order to third-order coefficients $a_1-a_3$ thereof are assumed to be arbitrarily changed to other values.

The input data $Xt$ from the terminal 11 is supplied to a time window circuit 21 wherein the data $Xt$ is weighted by a predetermined significance, and then supplied to an auto-correlation circuit 22 to calculate the correlation coefficient which in turn is supplied to a predictive coefficient circuit 23 wherein the partial auto-correlation coefficients (PARCOR coefficients) $a_1-a_3$ are calculated as the first-order to third-order predictive coefficients for each block of the input data $Xt$.

Also, the data $Xt$ is supplied from the delay circuit 12 to a predictive difference filter 24, the output of which is supplied to a detecting circuit 25 for detecting a maximum value in the block.

In this case, the filter 24 comprises a third-order predictive filter 241 constructed in the same manner as the predictive filter 19 and a subtracting circuit 242 such that the predictive coefficients $a_1$ to $a_3$ from the coefficient circuit 23 are supplied to the filter 241, and a predictive value $\tilde{D}t$ (predictive difference) of the difference $Dt$ for the input data $Xt$ is generated for each sample. The detecting circuit 25 detects an absolute value $\tilde{D}_{max}$ of the predicted difference which has the largest absolute value within 64 predicted differences $\tilde{D}t$ in each block of the input data $Xt$.

The maximum value $\tilde{D}_{max}$ is supplied to a normalization gain calculating circuit 26 wherein it is converted to the data with gain G at the time of normalization in accordance with the following equation:

$$G = b/\tilde{D}_{max}$$

where b represents a safe coefficient in the range of $0 < b < 1$, for example, $b = 0.9$.

The data G is supplied to the gain control circuits 15 and 17 as well as to the gain control circuit 41 through a latch 52. Since the following equations:

$$Dt \cdot G = Dt \cdot b/D_{max}$$
$$= Dt \cdot b/(\text{Maximum value of } Dt)$$
$$Dt \approx Dt$$

are satisfied, the value $Dt \cdot G$ is normalized in the range expressed by $-1 \leq Dt \cdot G < 1$.

Incidentally, the quantity of data transmitted from the encoder section 10 through the transmission system 30 to the decoder section 40 are calculated as follows:

Since the main data $\hat{D}t \cdot G$ formed, for example, of four bits is transmitted at every one sample and the supplementary data, that is, the predictive coefficients $\alpha_1$, $\alpha_2$ and $\alpha_3$ and the data G respectively formed, for example, of 16 bits, 12 bits, 12 bits and 8 bits are transmitted at every one block, the total quantity of data transmitted in every one block period is:

4 bits/sample × 64 samples + 16 bits + 12 bits + 12 bits + 8 bits = 304 bits

If a fourth-order predictive filter is employed, the predictive coefficients $\alpha_1 - \alpha_4$ respectively formed of eight bits and the data G formed, for example, of 16 bits are transmitted in one block period, so that the total quantity of transmitted data is calculated as follows:

4 bits/sample × 64 samples + 8 bits × 4 coefficients + 16 bits = 304 bits thus, it will be understood that the construction of these data can be arbitrarily determined.

If data is not compressed, the quantity of data transmitted in one block period is calculated as follows:

16 bits/sample × 64 samples = 1024 bits

Thus, the data quantity is compressed to nearly 29.7% (304 bits/1024 bits) and transmitted.

As described above, the digital audio data can be effectively compressed by the present invention. Particularly, even if the word length of the coefficients and operation is limited, errors caused by the compress of the decoded data Xt can be minimized since the predictive coefficients generated by the predictive filters 19 and 43 are optimally controlled in accordance with the input data Xt.

In the event of transmitting the predictive residual Dt, the predictive residual $\hat{D}t$ is first normalized and thereafter re-quantized to reduce the number of bits, whereby the word length of the transmitted data $\hat{D}t \cdot G$ can be shortened and errors contained therein can be decreased.

Figure 3:
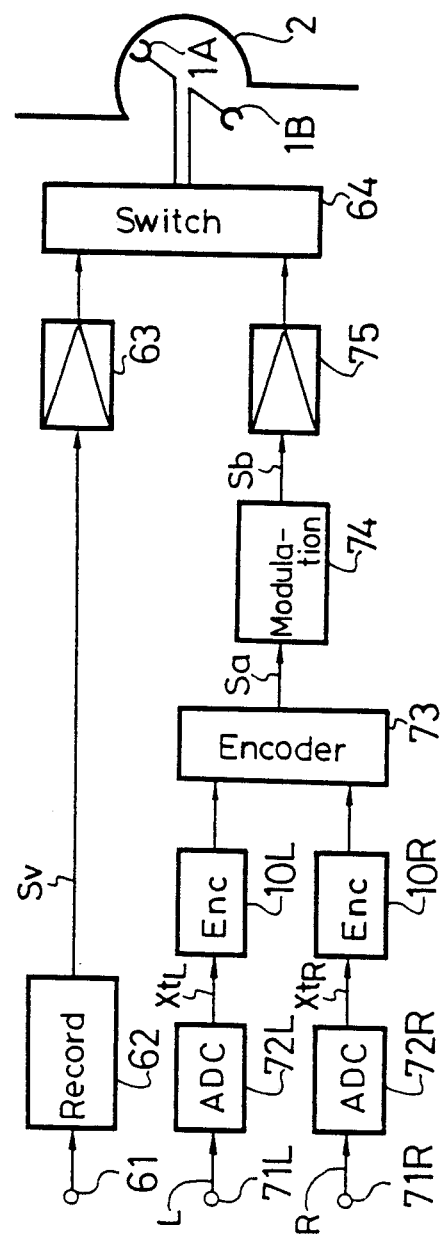
FIG. 3 is a circuit block diagram showing a recording system of a recording/reproducing apparatus in which the system of the present invention is embodied by way of example.

FIGS. 3 and 4 show examples in which the above-mentioned encoder section 10 and decoder section 40 are respectively applied to a recording system and a reproducing system for processing audio signals in an 8-mm video tape recorder.

In the recording system shown in FIG. 3, an NTSC-standard color video signal, for example, is supplied through a terminal 61 to a video recording circuit 62 wherein the luminance signal is modulated to an FM signal and the carrier chrominance signal is frequency-converted to a signal in a band lower than the FM-modulated luminance signal, that is, a signal whose carrier frequency Fc is 47.25 fh ($\approx$743 kHz, where fh represents the horizontal frequency). Then, a signal Sv indicative of the sum of the FM-modulated luminance signal, the low-band converted carrier chrominance signal and a pilot signal for tracking servo upon reproduction is extracted from the video recording circuit 62 and which is then supplied through a recording amplifier 63 to a switch circuit 64.

Further, left-channel and right-channel stereo audio signals L and R are supplied through terminals 71L and 71R to A/D converters 72L and 72R, respectively, wherein the respective signals L and R are analog-to-digital (A/D) converted to digital data $Xt_L$ and $Xt_R$ with the sampling frequency at 48 kHz and the quantizing bit number of 16 bits. The data $Xt_L$ and $Xt_R$ are respectively supplied to encoders 10L and 10R which are constructed in the same manner as the above-mentioned encoder section 10 from which the data $\hat{D}t \cdot G$, $\alpha_1 - \alpha_3$ and G are extracted for each channel.

These data signals are supplied to a recording encoder 73 wherein they are subjected, at every one field portion, to recording encoding processing such as addition of error correcting data, interleave, time-base compression to approximately 1/5 posterior field period of the respective field periods, and so on. The signal effected the above processing, designated a digital signal Sa, is supplied to a modulating circuit 74 to be modulated, for example, to a bi-phase mark signal Sb which in turn is supplied through a recording amplifier 75 to the switch circuit 64.

The switch circuit 64 is controlled at a predetermined timing such that the signal Sv is supplied at one field period alternately to rotary magnetic heads 1A and 1B, while the signal Sb is supplied to the heads 1A and 1B in the opposite relationship to the signal Sv.

The heads 1A and 1B are angularly spaced by 180° from each other and rotated at the rate of the frame frequency in synchronism with the color video signal from the terminal 61. A magnetic tape 2 is wrapped around the rotating peripheral surface over 216° of the head travel and obliquely transported at a constant velocity. The heads 1A and 1B respectively have a slit angle or a so-called azimuth angle different from each other.

Thus, on the tape 2, as shown in FIG. 5, tracks 2T are sequentially formed adjacent to each other, in each of which tracks the signal Sb is recorded in a 36° range from its beginning and the signal Sv in the remaining 180° range thereof.

The above described recording system and the recording format are the same as those adapted to the conventional 8-mm video tape recorder, except for the signal Sa which is modulated to generate the signal Sb.

In the reproducing system shown in FIG. 4, the head 1A sequentially reproduces the signals Sv and Sb from every other track 2T, and the head 1B sequentially reproduces the signal Sv and Sb from the remaining every other track 2T. These signals Sv and Sb thus reproduced are supplied through reproducing amplifiers 81A and 81B to a switch circuit 82 from which the signals Sv reproduced by heads 1A and 1B are sequentially extracted and the signals Sb reproduced by the heads 1A and 1B are extracted from the approximately 1/5 posterior field period of each field.

The signal Sv from the switch circuit 82 is supplied to a video reproducing circuit 83 wherein the opposite processing to that upon recording is effected to deliver the original color video signal to a terminal 84.

The signal Sb from the switch circuit 82 is supplied to a demodulating circuit 91 which demodulates the signal Sa which is supplied to a reproducing decoder 92 wherein time-base expansion, error correction, error consealment and so on are effected to thereby decode the original data signals Dt·G, $\alpha_1$-$\alpha_3$, and G. These data signals are supplied to decoders 40L and 40R constructed similarly to the aforementioned decoder section 40 to be decoded as the data $Xt_L$ and $Xt_R$ which are supplied to D/A converters 93L and 93R, respectively, from which the original audio signals L and R are reproduced and delivered to terminals 94L and 94R, respectively.

The audio signals L and R are recorded and/or reproduced as described above, wherein the quantity of the data $\hat{Dt}$·G, $\alpha_1$-$\alpha_3$ and G (except for the error correction data and so on) recorded on the tape 2 for one second is calculated as follows:

(48,000 samples/64 samples) blocks × 304 bits × 2 channels = 456 × 10³ bits

In the PCM audio signals in accordance with the present 8-mm video tape recorder, the sampling frequency is determined to be 2 fh=31.468 kHz and the quantizing bit number is eight bits, so that the quantity of data recorded on the tape 2 for one second is calculated as follows:

31468 samples × 8 bits × 2 channels = 503 × 10³ bits

It will be understood from the above calculations that the data signals Dt·G, $\alpha_1$-$\alpha_3$ and G can be sufficiently recorded and/or reproduced in accordance with the 8-mm video taper recorder standard.

However, the above-mentioned system cannot elevate the accuracy of the predictive coefficients $\alpha_1$-$\alpha_4$ (in the case where a fourth-order predictive filter is employed).

Specifically explaining, as the time window function (weighting function) W(n) in the time window circuit 21, a Hamming window is generally used which is expressed by the following equation:

W(n) = 0.54 − 0.46cos (2πn/(N−1))

wherein N represents the number of data in one block (N=64) and n a data number in one block (0 ≦ n ≦ N−1).

The data St thus weighted is supplied to the auto-correlation circuit 22 wherein an auto-correlation coefficient vj is calculated in accordance with the following equation:

$$v_j = \frac{1}{N} \sum_{n=0}^{n-j-1} X_n \cdot X_{n+j}$$

where Xn represents the weighted data Xt at t=n; j=0, 1, 2, ...., p; and p represents the order of the predictive function (p=4).

Figure 6:
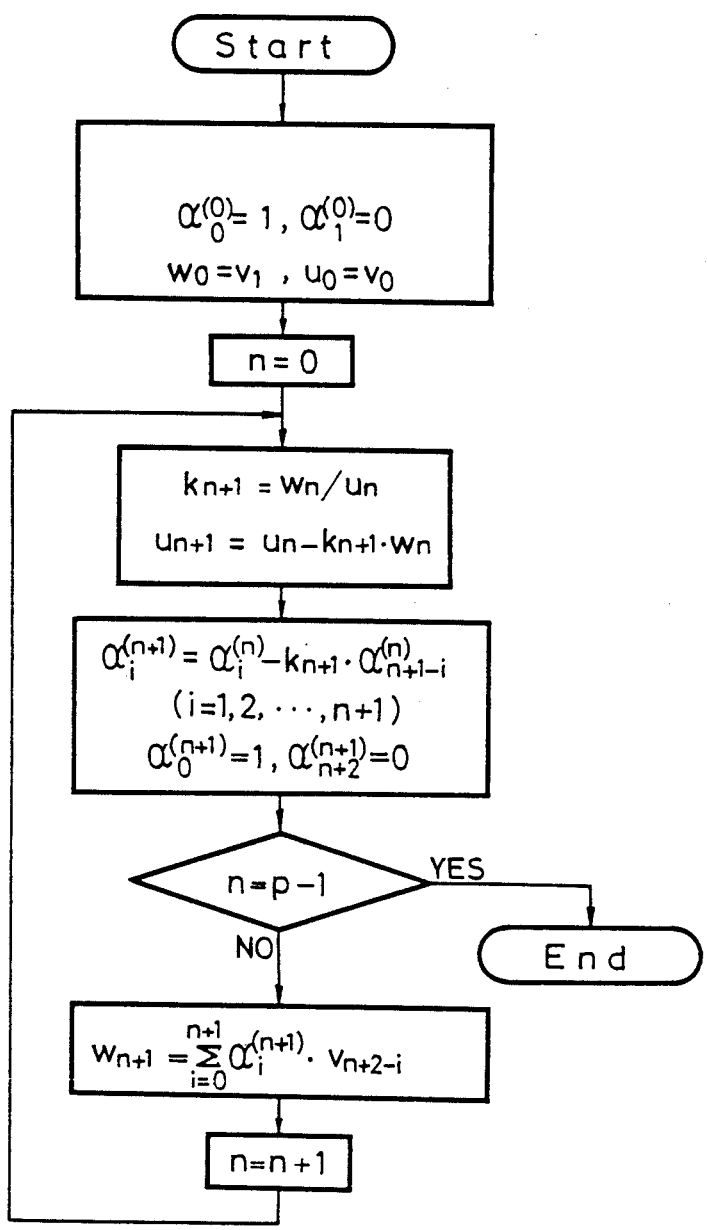
FIG. 6 is a flowchart showing a process using durbin's algorithm.

The predictive coefficient circuit 23 generates the predictive coefficients, for example, according to an algorithm shown in a flowchart of FIG. 6 wherein the respective symbols represent as follows:

$v_0$: a zero-order auto-correlation coefficient;
$v_1$: a first order auto-correlation coefficient;
$\alpha_i^{(n+1)}$: a forward linear predictive coefficient, $\alpha_i^{(n+1)} = \alpha_i$;
wn : a cross-correlation between a forward predictive residual and a backward predictive residual;
un : a root-mean value of the forward predictive residual;
$k_{n+1}$: A partial auto-correlation coefficient, $k_{n+1} = \alpha_{n+1}^{(n+1)}$
p : The order number of the predictive filter (p=4)

Therefore, the accuracy of the predictive coefficient $\alpha i$ is determined in the order of the accuracy of the weighted data Xt (=Xn), the accuracy of the auto-correlation coefficient vj and the cross-correlation wn, the accuracy of the partial correlation coefficient $k_{n+1}$, and the predicative coefficient $\alpha i$.

Assuming that the time window function of the time window circuit 21 is the Hamming window as described above, the significance W((N−1)/2) for the data Xt located at the W((N−1)/2)=1.

However, the significance W(0) and W(N−1) for the data Xt at the beginning and the end of the block are respectively as follows:

W(0)=0.08 and W(N−1)=0.08

Thus, the weighted data Xt at near t=0 and t=N−1 become extremely small values.

At this time, since the data Xt has its word length limited, the lower bits thereof are rounded off, whereby the accuracy of the weighted data Xt becomes unacceptably low.

The accuracy of the weighted data Xt influences directly on the predictive coefficient $\alpha i$, as described above, so that the accuracy of the predictive coefficient $\alpha i$ becomes lower as the accuracy of the weighted data Xt is degraded.

The above explanation is given to the case where the time window function W(n) is the Hamming window function. Nevertheless, the accuracy of the predictive coefficient $\alpha i$ becomes lower by the same reason in the other window functions and a case where the input data Xt is small over the whole block, regardless of the kind of the time window function W(n).

As described above and also as shown in FIG. 6, the accuracy of the predictive coefficient $\alpha i$ depends on the accuracy of the coefficient $k_{n+1}$ which is calculated by dividing the value wn by the value un. Even if a dividend and a divisor (a numerator and a denominator) are previously multiplied by the same constant value in the event of the division, the coefficient $k_{n+1}$ which is the quotient of the division is not influenced at all.

In view of the above-mentioned fact, the present invention also provides a system of producing the predictive coefficient i by multiplying the weighted data Xt by a predetermined coefficient (≧1) determined at each block and utilizing the product. The coefficients to be multiplied may be selected from a range such that the products can be expressed by the data formula representing the data Xt.

Two embodiments of the above system according to the invention will hereinafter be described with reference to FIGS. 7 and 8.

Figure 7:
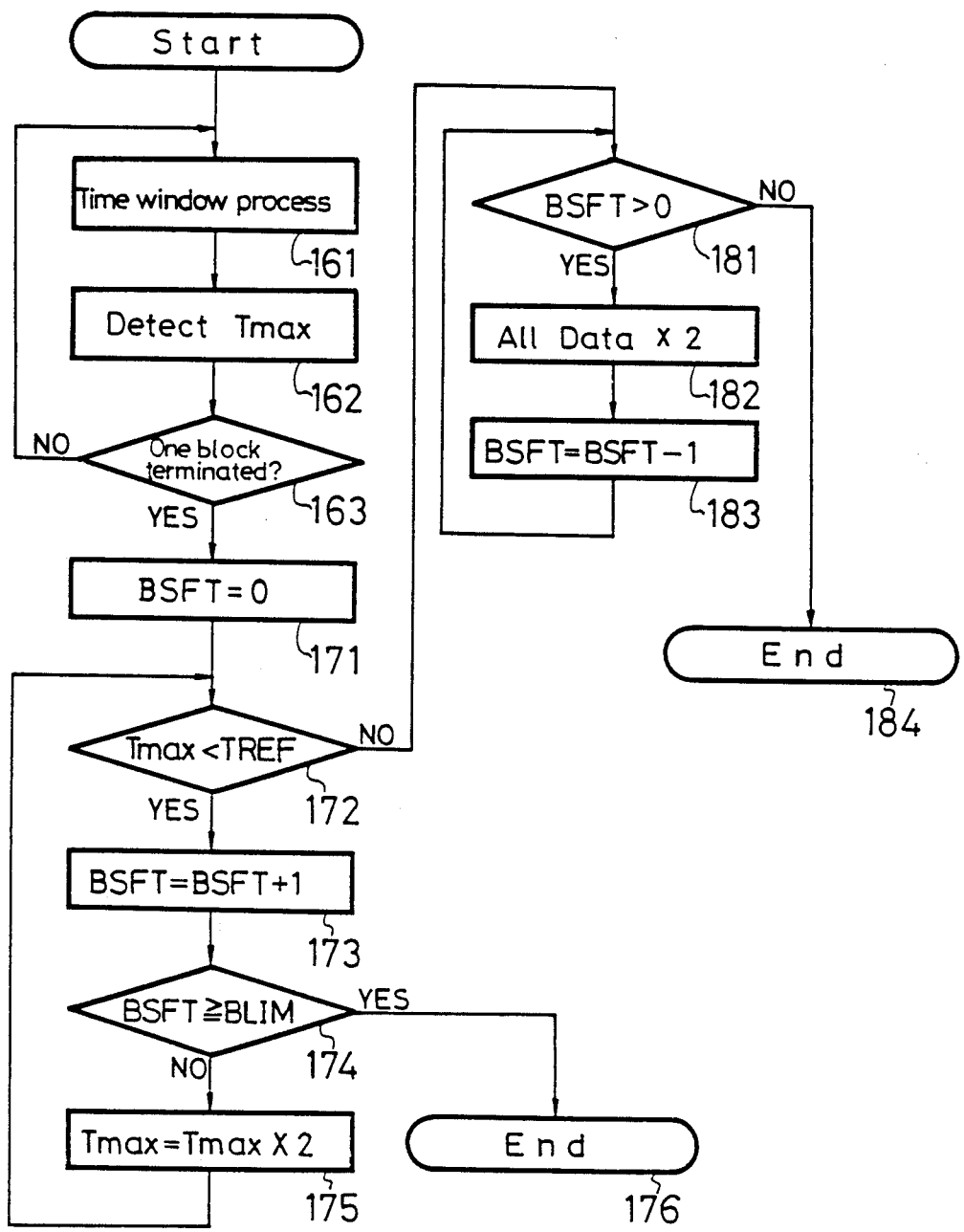
FIG. 7 is a flowchart showing the time window operation according another, embodiment of the present invention.

The time window circuit 21 executes the the operation as shown in the flowchart of FIG. 7.

First, the input data Xt (one sample portion) from the terminal 11 (refer to FIG. 2) is multiplied by the time window function W(n) for weighting to provide data Xt·W(n) at step 161. Next, the data Xt·W(n) derived in the present loop is compared with the maximum value (absolute value) of the previously derived data Xt·W(n) to deliver the maximum value of the data Xt·W(n). It is next checked at step 163 whether the operations of steps 161 and 162 have been effected on all 64 samples in one block. If the answer is NO, the execution returns to step 161, whereas if the answer is YES, the execution proceeds to step 171.

Thus, by the processes of steps 161-163 all input data in one block is weighted by the time window function W(n) and the maximum value (absolute value) $T_{max}$ of the weighted data Xt·W(n) is derived. In the above-mentioned processes, the data Xt is processed by 16 bits, the function W(n) by eight bits, and the data Xt·W(n) and $T_{max}$ by 24 bits to ensure the necessary accuracy for the data Xt·W(n) and $T_{max}$.

Next, at step 171, a counter BSFT for the bit shift is reset to "0" and the execution proceeds to step 172 wherein the maximum value $T_{max}$ is compared with a predetermined constant value TREF which is selected such that its word length is several bits shorter than the word length of the data $T_{max}$ or 24 bits. In other words, the value TREF is selected to be, for example $\frac{1}{4}$ ($\frac{1}{2}^2$) the maximal value of the data $T_{max}$ which can be expressed by 24 bits.

If the comparison result shows that $T_{max}$ is smaller than TREF ($T_{max}$<TREF), the counter BSFT is incremented by one at next step 173 and the counted value of the counter BSFT is compared with a predetermined constant value BLIM at step 174. This comparison is provided to avoid the infinite execution of the operation loop formed by steps 172-175, as will be later referred to, so that the value BLIM is selected to be, for example, "24" corresponding to the word length of the data $T_{max}$.

If the comparison result shows that BSFT<BLIM stands, the execution proceeds to step 175 wherein the data $T_{max}$ is shifted leftward by, for example, one bit to be doubled, and thereafter returns to step 172.

Thus, by repeating the loop formed by steps 172-175, the data $T_{max}$ is sequentially shifted leftward by one bit to be doubled every time the operations of steps 172-175 are executed, and the frequency of the left-shift operations is recorded by the counter BSFT. Incidentally, if the data $T_{max}$ is zero, the operations of steps 172-175 will be infinitely repeated, while $T_{max}=0$ is kept. To avoid such inconvenience, step 174 is provided to check the counted value of the counter BSFT, such that if BSFT≧BLIM stands, the execution proceeds to step 176 to terminate the operation.

By repeating the loop formed by steps 172-175, the data $T_{max}$ is sequentially shifted leftward by one bit to be doubled. Consequently, if $T_{max}$≧TREF stands, the execution proceeds from step 172 to step 181. The resultant value $T_{max}$ has been multiplied by two to the power of the counter value BSFT, however, it will never overflow since the value TREF used as the comparison base is, for example, $\frac{1}{4}$ ($\frac{1}{2}^2$) the maximum value expressed by the word length of the data $T_{max}$ (24 bits in this embodiment).

At step 181, it is checked whether the counted value BSFT is larger than zero. If the answer is YES, that is, if BSFT>0 stands, the execution proceeds to step 182 wherein all the data Xt·W(n) in one block is shifted leftward by one bit to be doubled. Next, at step 183 the counted value BSFT is decremented by one, and subsequently the execution returns to step 181.

Thus, by the operations of steps 181-183, all the 64 sample data Xt·W(n) in one block are shifted leftward by one bit to be doubled, and when all the data Xt·W(n) have been shifted leftward by a number initially set at the counted value BSFT (BSFT bits), the counted value BSFT becomes zero.

When the value BSFT is equal to zero, the execution proceeds from step 181 to step 184 to terminate the operation.

Since the weighted data Xt·W(n) is supplied to the auto-correlation circuit 22 in the next stage after it has been shifted leftward by the BSFT bits, even if lower (LSB side) bits are rounded off due to the word-length limitation in the subsequent operations, the accuracy of the coefficient $k_{n+1}$ will never be damaged, whereby the predictive coefficient αi can be generated with high accuracy.

The data Xt·W(n) at this time is shifted leftward by the BSFT bits, which means that it is multiplied by two to the power of the BSFT bits. However, the value BSFT is selected in a manner that the maximum value of the data Xt·W(n) in each block multiplied by two to the power of the BSFT bits does not overflow, so that the remaining data Xt·W(n) will never overflow even if they are also multiplied by two to the power of BSFT bits.

According to the present embodiment as described above, the weighted data Xt·W(n) are multiplied at block unit without causing the maximum value $T_{max}$ to be an overflow, so that the accuracy of the predictive coefficient $^{60}$i can be elevated even if the word length is limited in subsequent operations.

In the above-mentioned operations shown in FIG. 7, steps 161-163 may be executed by the time window circuit 21, and a circuit may be provided between the time window circuit 21 and the auto-correlation circuit 22 for executing steps 171-184.

The above operations were explained with reference to the flowchart of FIG. 7, however, the operations of steps 161-184 can be implemented by discrete hardware. Further, the partial auto-correlation coefficient (PARCOR coefficient $k_i$ may be used as the predictive coefficient αi.

In the above-mentioned system, the word-length limitation sometimes makes the calculation of the predictive coefficients $k_1$-$K_4$ unstable. Specifically, the predictive coefficient circuit 23 provides the predictive coefficients in accordance with the durbin algorithm as shown in FIG. 6. When this algorithm is implemented by hardware, even if $w_{n-1}=0$, that is, $k_n=0$ stands, since the word-length is limited, there appears such a case where the value wn and the coefficient $k_{n+1}$ do not become zero. Moreover, the coefficient $k_{n+1}$ is determined by the ratio of the value wn to the value un, so that when the value un is small, the coefficient $k_{n+1}$ becomes large. Accordingly, with the employment of such coefficient $k_{n+1}$, a whole system employing the predictive filter is made unstable and, in the worst case, may cause oscillation.

In consideration of the coefficient $k_i$, it is generally known that a lower-order correlation is stronger than a higher-order correlation. Therefore, if $k_n$ is equal to zero, $k_{n+1}\neq 0 - k_p \neq 0$ will never stand (however they stand due to the word-length limitation).

In view of the above-mentioned fact, the present invention further provides a system of setting "0" to all the coefficient $k_{n+1}-k_p$ higher than (n+1)th order when it is detected that $k_n$ is equal to zero, that is, if the correlation is not encountered.

An embodiment of such system will hereinafter be explained with reference to FIG. 8.

Figure 8:
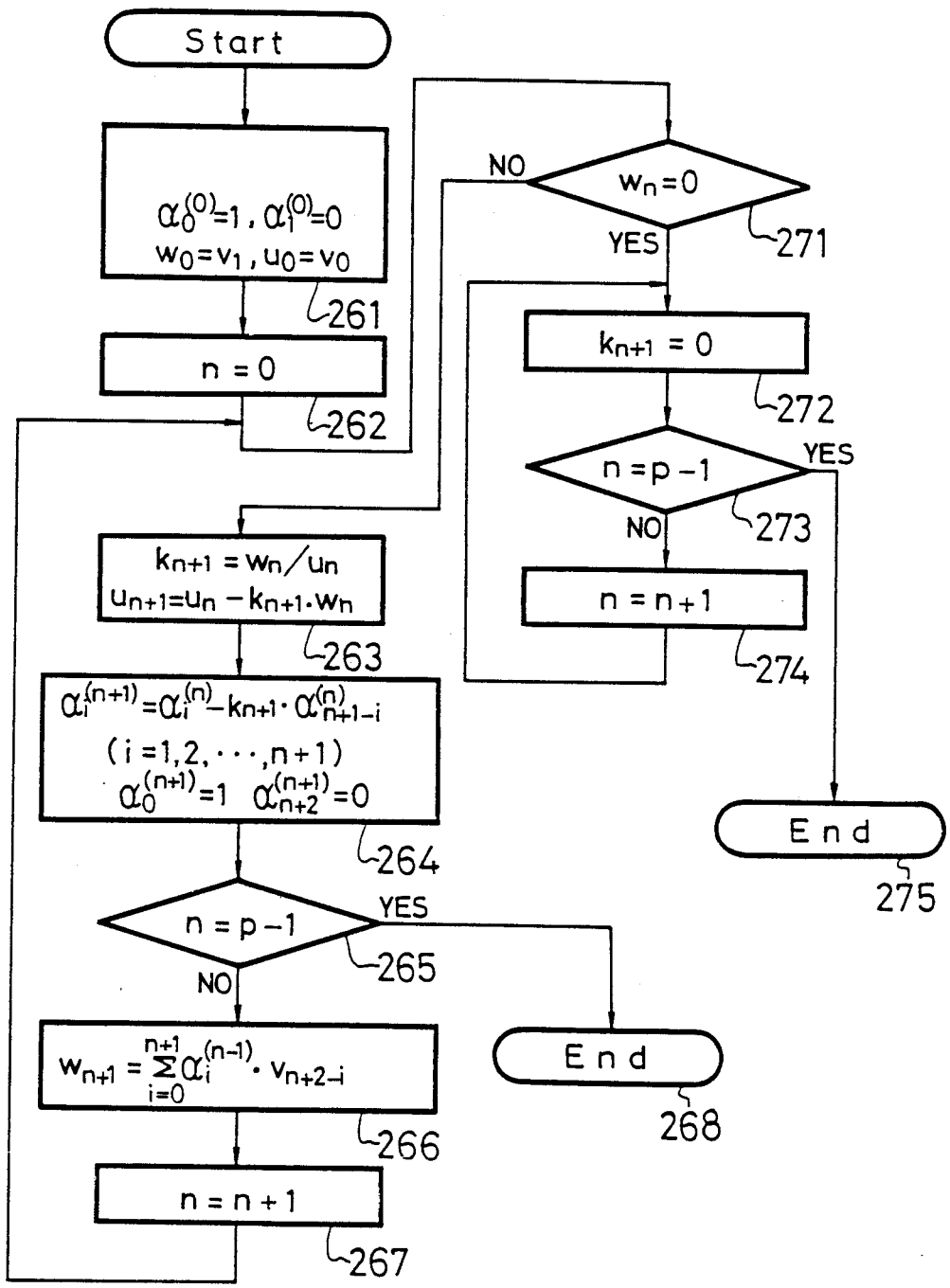
FIG. 8 is a flowchart showing a process of producing the predictive coefficients to which the durbin's algorithm is applied.

The predictive coefficient circuit 23 provides the predictive coefficient $k_i$ in accordance with the process as shown in FIG. 8. Steps 261-268 in this process are the durbin's algorithm which has been shown also in FIG. 6. However, step 271 is provided between steps 262 and 263 for determining whether the value wn is equal to zero or not. In the answer at step 271 is NO, that is, if wn≈0, the execution proceeds to step 263. It will be appreciated that as long as the value wn is not equal to zero, the operation in accordance with the flowchart of FIG. 8 is the same as that of FIG. 6, and accordingly, the target coefficient $k_i$ is outputted.

On the other hand, if it is detected that the value wn is equal to zero at step 271, the execution proceeds to step 272 wherein the coefficient $k_{n+1}$ is set to zero. Next, at step 273, it is detected whether the value n is equal to p−1 or not If the answer is NO (n≠p−1), the execution proceeds to step 274 wherein the value n is incremented by one and then returns to step 272. On the other hand, if the answer is YES (n=p−1) at step 273, the execution proceeds to step 275 to terminate the operation according to this algorithm.

It will therefore be understood that when wn=0 stands, the coefficients $k_{n+1}-K_p$, that is, the coefficients having the order number higher than the value n are all set to zero by the operations effected in steps 272-275.

If the coefficients $k_{n+1}-K_p$ are all equal to zero, it is possible to prevent the system from being unstable and causing oscillation. Even if the coefficients $k_{n+1}-K_p$ are all set to zero when the value wn is equal to zero, the increased errors caused in the predictive filters 241, 19 and 43 are small enough to be ignored since the higher-order correlation is generally weak.

According to the present invention as described above, even though the coefficients and operations are limited in their word length, the predictive coefficients of the predictive filters 19 and 43 are controlled to be optimal values in accordance with the input data Xt, thereby making it possible to minimize errors caused by the compression of the decoded data Dt.

Further, when the predictive residual Dt is transmitted, since this predictive residual Dt is first normalized and thereafter re-quantized to reduce its bit length, the data Dt·G to be transmitted becomes shorter in its bit length and has less errors.

Moreover, since the weighted data Xt·W(n) in each block is multiplied by a coefficient in a manner that its maximum value $T_{max}$ does not overflow, the accuracy of the predictive coefficient αi can be made higher even if the word length is limited in the subsequent operations.

Also even though the word length is limited in the course of calculating the predictive coefficients $k_1-K_p$, the predictive coefficients $k_{n+1}-k_p$ having an order number larger than the value n are all set to, for example, zero when the value wn is equal to zero, the system will never cause unstable operation nor oscillation.

The above description is given on preferred embodiments of the invention but it will be apparent that many modifications and variations could be effected by one skilled in the art without departing from the spirits or scope of the novel concepts of the invention so that the scope of the invention should be determined by the appended claims only.

What is claimed is:

1. A system for transmitting data blocks quantized in accordance with adaptive quantization in differential pulse code modulation, the quantized data transformed from source data by a predetermined sampling frequency, comprising:
   means for producing a predictive coefficient from sampled data contained in every data block, which is composed of a predetermined number of the sampled data;
   means for producing a normalization gain from said sampled data in every data block;
   means connected to receive said predictive coefficient for producing a predictive residual in accordance with the predictive coefficient at every sampled datum in the data block corresponding to the predictive coefficient;
   means connected to receive said predictive residual for normalizing said predictive residual of the data block corresponding to the normalization gain in accordance with the normalization gain to produce a normalized predictive residual;
   means connected to receive said normalized predictive residual for transmitting said normalized predictive residual to a decoder, one said sampled datum at a time; and
   means connected to receive said predictive coefficient and said normalized gain for transmitting said predictive coefficient and said normalization gain to the decoder, one said data block at a time.

2. A method of adaptive quantization in differential pulse code modulation for quantized data transformed from source data by a predetermined sampling frequency, for coding the source data using a predictive residual for every data block which is composed of a predetermined number of sampled data, said method comprising the steps of:
   detecting auto-correlation of said quantized data;
   interrupting the detecting step when it is detected that quantized data does not have the auto-correlation in said detecting step; and
   setting correlation data, corresponding to data subsequent to the quantized data which does not have said auto-correlation, to a preselected constant value.

3. A method of adaptive quantization in differential pulse code modulation for quantized data transformed from source data by a predetermined sampling frequency, for coding the source data using a predictive residual for every data block which is composed of a predetermined number of sampled data, the method comprising the steps of:
   weighting the quantized data by a predetermined significance;
   detecting the datum with the largest value in each of said data block;
   multiplying the largest datum by a predetermined coefficient such that the largest datum is larger than a predetermined value; and
   producing predictive coefficients by multiplying other samples in each of the data blocks by the predetermined coefficient.

* * * * *